United States Patent [19]

McEachern

[11] Patent Number: 5,481,468
[45] Date of Patent: Jan. 2, 1996

[54] METHOD AND APPARATUS FOR STORING AN INCREASING NUMBER OF SEQUENTIAL REAL-TIME SAMPLES IN A FIXED AMOUNT OF MEMORY

[75] Inventor: Alexander McEachern, Oakland, Calif.

[73] Assignee: Basic Measuring Instruments, Inc., San Jose, Calif.

[21] Appl. No.: 925,570

[22] Filed: Aug. 4, 1992

[51] Int. Cl.$^6$ ........................................ G01R 1/00
[52] U.S. Cl. .................................. 364/481; 377/26
[58] Field of Search ......................... 364/481, 550, 364/551.01, 483; 377/19, 26, 33, 51, 52

[56] References Cited

U.S. PATENT DOCUMENTS

| | | | |
|---|---|---|---|
| 4,009,371 | 2/1977 | Hamilton et al. | 235/92 |
| 4,283,713 | 8/1981 | Philipp | 340/347 |
| 4,308,585 | 12/1981 | Jordan | 364/520 |
| 4,477,920 | 10/1984 | Nygaard, Jr. | 377/52 |
| 4,670,891 | 6/1987 | Salowe et al. | 377/20 |
| 4,811,249 | 3/1989 | Marsh | 364/550 |
| 5,010,560 | 4/1991 | Janney et al. | 377/20 |
| 5,088,488 | 2/1992 | Markowitz et al. | 128/706 |

Primary Examiner—Ellis B. Ramirez
Assistant Examiner—Edward Pipala
Attorney, Agent, or Firm—Haverstock & Associates

[57] ABSTRACT

In data logging applications, a method and apparatus are disclosed for storing an increasing number of consecutive real-time data points, such as those descriptive of AC (alternating current) power line parameters, in a fixed amount of memory by periodically applying a novel compression technique. The compression technique preserves time relationships in the data while maximizing the level of detail consistent with a limited amount of memory. When the memory is full each data point stored is paired with another data point and one value is calculated that will represent the pair of data points, reducing the necessary memory to half and allowing more data points to be stored.

4 Claims, 6 Drawing Sheets

100 Voltage Sample Memory    101

| | Min. | Max. | Average |
|---|---|---|---|
| 103→ | 102.5 | 115.9 | 114.6 |
| 104→ | 115.2 | 117.3 | 116.8 |
| | 113.7 | 120.6 | 117.2 |
| | 114.7 | 118.2 | 116.0 |
| | 112.2 | 114.6 | 113.2 |
| | 110.3 | 113.6 | 112.4 |
| | 112.2 | 115.9 | 113.0 |
| | 0.0 | 108.6 | 92.2 | ⇐ Storage pointer 110

| Storage Interval |
|---|
| 1 minute |

↘102

*(before compression)*

100 Voltage Sample Memory    101

| | Min. | Max. | Average |
|---|---|---|---|
| 105→ | 102.5 | 117.3 | 115.7 |
| | 113.7 | 120.6 | 116.6 |
| | 110.3 | 114.6 | 112.8 |
| | 0.0 | 115.9 | 102.6 |
| | –empty– | –empty– | –empty– | ⇐ Storage pointer 110
| | –empty– | –empty– | –empty– |
| | –empty– | –empty– | –empty– |
| | –empty– | –empty– | –empty– |

| Storage Interval |
|---|
| 2 minutes |

↘106

*(after compression)*

(before compression)

(after compression)

5,481,468

METHOD AND APPARATUS FOR STORING AN INCREASING NUMBER OF SEQUENTIAL REAL-TIME SAMPLES IN A FIXED AMOUNT OF MEMORY

BACKGROUND OF THE INVENTION

1. Field of the Invention

This invention relates to instruments for logging real-time data, such as AC (alternating current) power line parameters. More specifically, this invention relates to methods for recording data representative of an unlimited number of successive real-time samples in a limited amount of digital memory.

2. Description of Prior Art

Many parameters measured by data logging instruments vary with time. For example, common AC (alternating current) power system parameters, such as voltage, current, volt-amps, watts, and power factor, vary with time. It is often necessary to record these variations over time so that adjustments can be made to the system being measured.

One common technique for recording time-varying parameters is to convert the parameter of interest into a digital value, then periodically store this digital value in a digital memory for later examination. For example, a recorder might convert the power system voltage to a 16-bit digital value once per second, then store this digital value so voltage variations can be graphed and examined at a later time.

However, this approach consumes an ever-increasing amount of digital memory as time passes. The example above consumes 172,800 bytes of storage per day; often many weeks of data are required, so this approach is impractical when memory space is limited by cost or other considerations.

Over the last 20 years, several techniques have been developed that attempt to find a method that employs a limited amount of memory to store a potentially unlimited number of time-varying parameter samples.

One prior art technique, commonly referred to as "triggered storage", only stores parameter samples when they exceed some pre-set trigger threshold. Systems that take this approach commonly store a limited number of pre-trigger and post-trigger samples as well. One commercially available instrument that uses this technique is the Dranetz Technologies Incorporated Model 656 Power Line Analyzer. This technique succeeds when trigger levels can be selected in advance. However, when system sensitivities are unknown, it is difficult to choose proper trigger levels. If the trigger levels chosen by the user are too sensitive, memory is wasted storing data that is not required. If the trigger levels chosen are not sensitive enough, important data may be discarded. Furthermore, identical instruments that employ this technique may produce different results when measuring identical signals, due to different trigger levels.

Another prior art technique, commonly referred to as "FIFO" (first in, first out) storage, stores parameter samples sequentially in memory. When the memory is full, this technique discards the oldest sample in memory, making room for the next sample. This process continues indefinitely. One commercially available instrument that makes use of this technique is the Basic Measuring Instruments Model 4800 PowerScope. This technique does not require the user to choose triggerlevels, and identical instruments produce identical results. However, the user is required to check the instrument periodically so he can retrieve any desired data from the instrument before it is automatically discarded to make room for new data.

Another prior art technique is commonly called "LIFO" (last in first out), or "terminate when full". This technique also stores parameter samples sequentially in memory. However, when the memory is full, all new samples are discarded. As a result, once data is recorded it is never lost, but possibly valuable data points which occurred after the memory was filled will not be saved.

Another prior art technique is to maintain several memories, and fill each of them at a different rate. For example, this technique might store power system parameters once per second in one memory, once per minute in a second memory, and once per hour in a third memory. Each of these memories employs one of the three techniques described above, and most typically use the FIFO technique. A commercially available instrument that employs this technique is the Basic Measuring Instruments Model 3030 PowerProfiler. This technique preserves all data under most circumstances, and does not require trigger levels. However, it uses memory inefficiently; under many circumstances most of the memory is empty.

It is the object of the present invention to record sequential parameter samples in a fixed amount of digital memory in a way that does not require trigger levels, that always preserves some representation of every sample, and that, after initialization, always keeps memory at least half full.

SUMMARY OF THE INVENTION

In data logging applications, a method and apparatus are disclosed for storing an increasing number of consecutive real-time data points, such as those descriptive of AC (alternating current) power line parameters, in a fixed amount of memory by periodically applying a novel compression technique. The compression technique preserves time relationships in the data while maximizing the level of detail consistent with a limited amount of memory. When the memory is full each data point stored is paired with another data point and one value is calculated that will represent the pair of data points, reducing the necessary memory to half and allowing more data points to be stored.

FIG, 1B shows an isometric drawing of an embodiment of the invention attached to a standard watt-hour recording meter.

Figure 2:
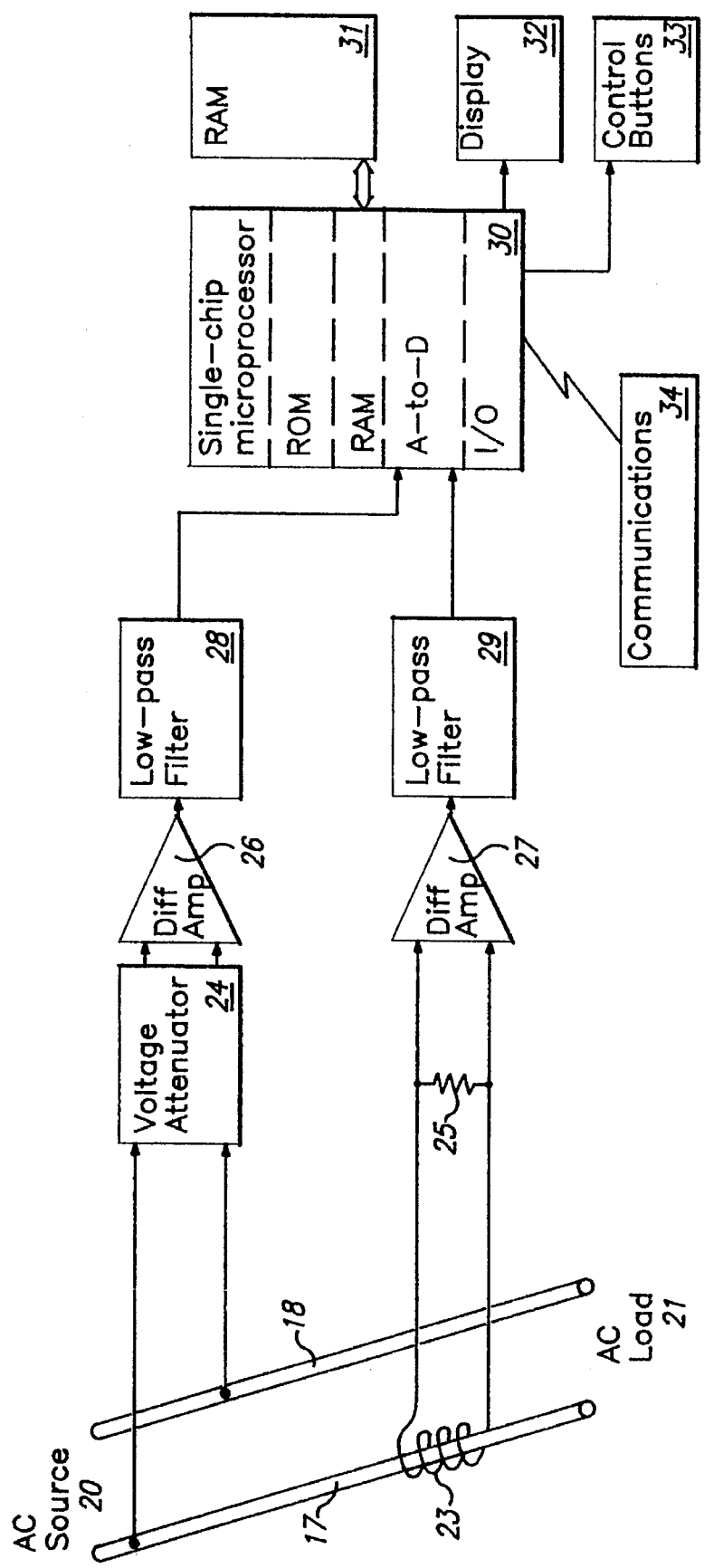

FIG. 2 shows a block digram of an embodiment of the invention.

Figure 3A:
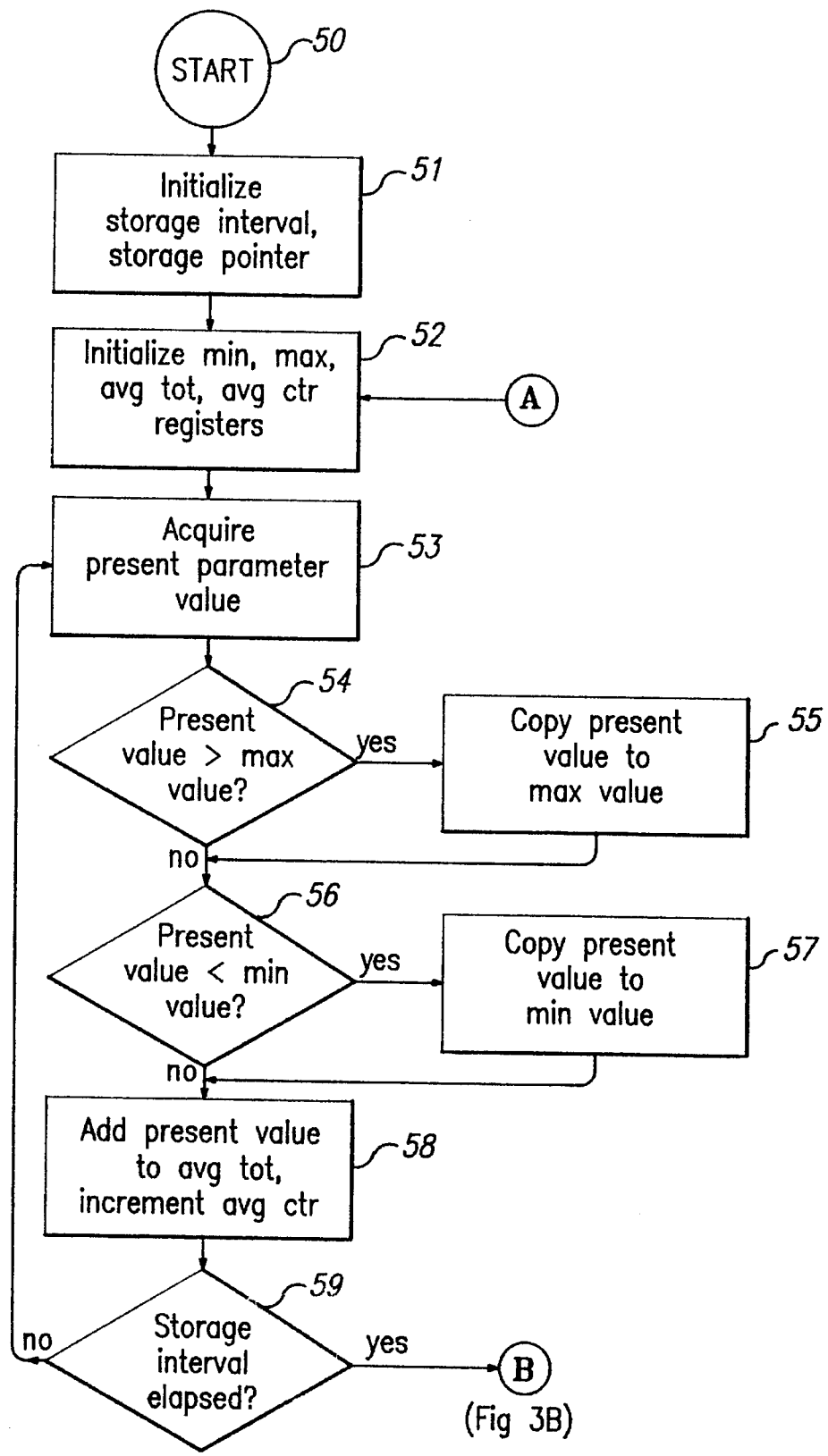
Figure 3B:
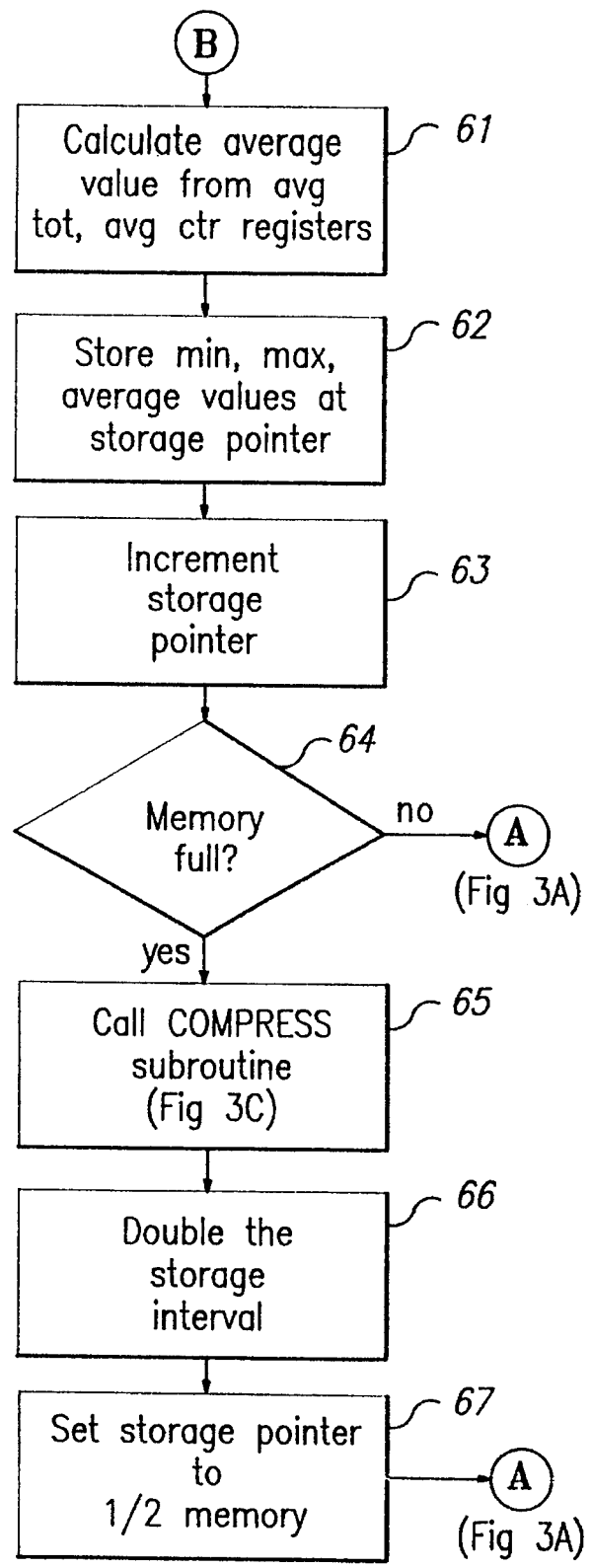
Figure 3C:
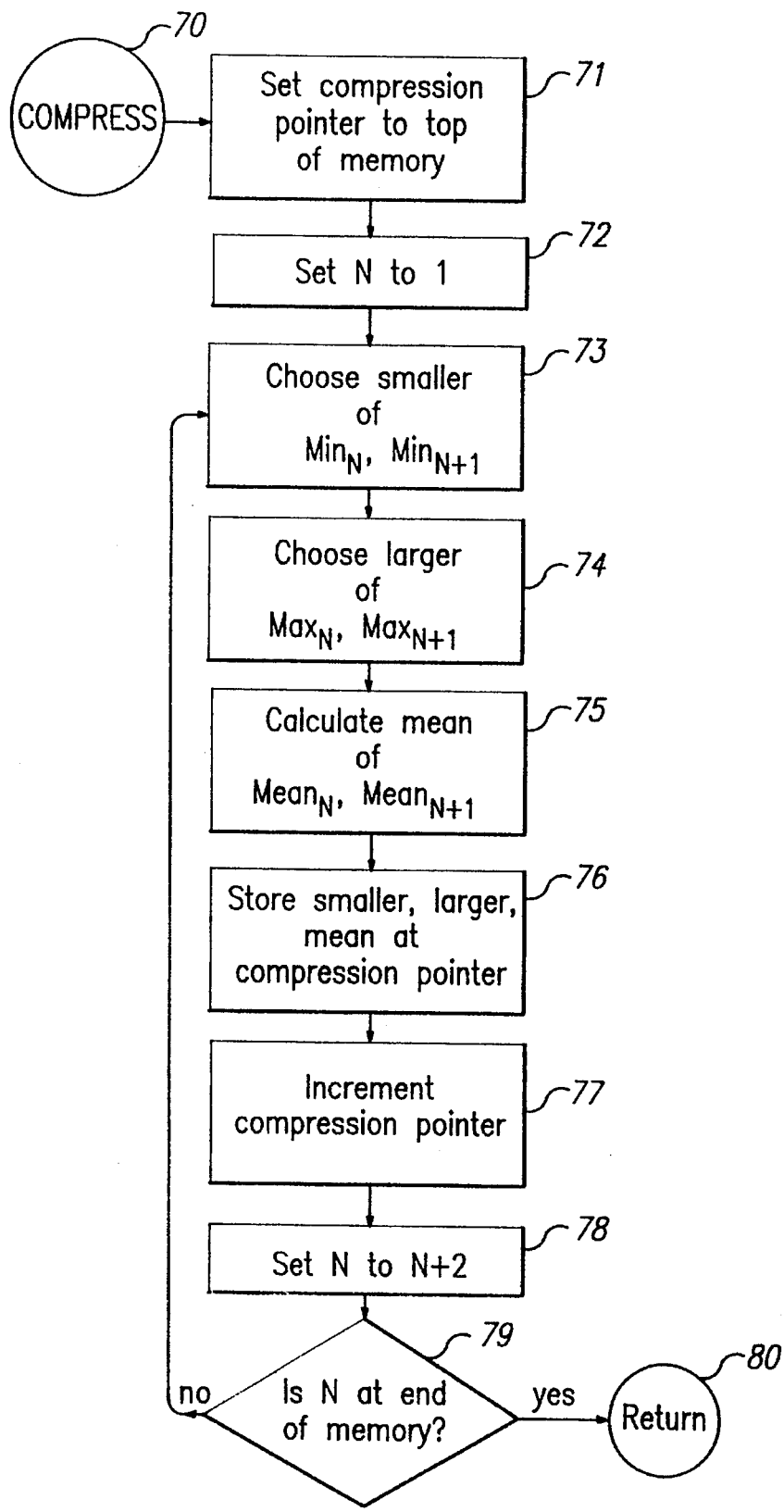

FIGS. 3A, 3B and FIG. 3C together show a flow diagram of a specific implementation of the key algorithm of the invention.

Figure 4A:
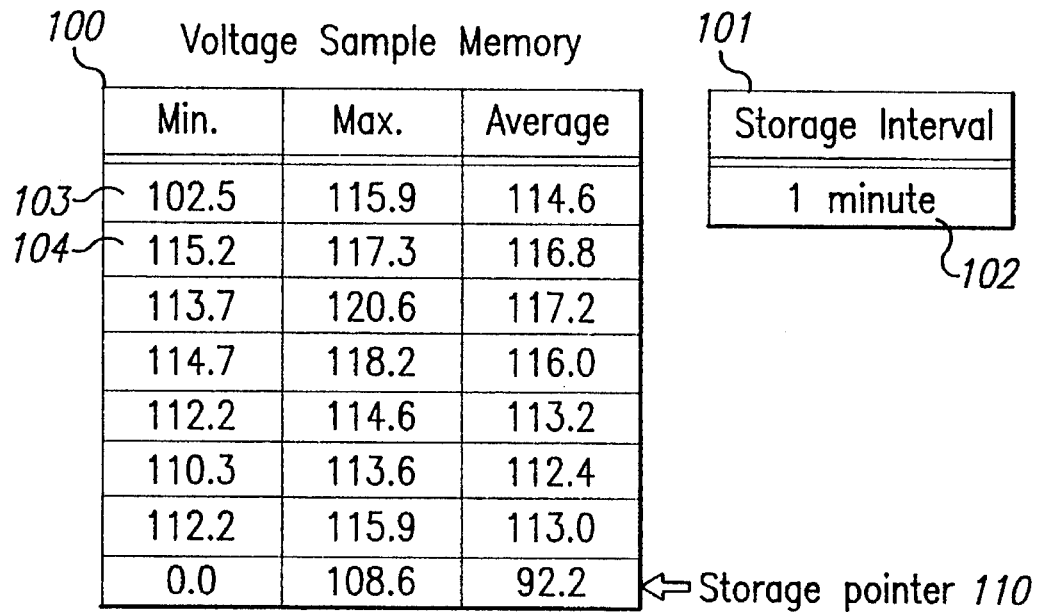
Figure 4B:
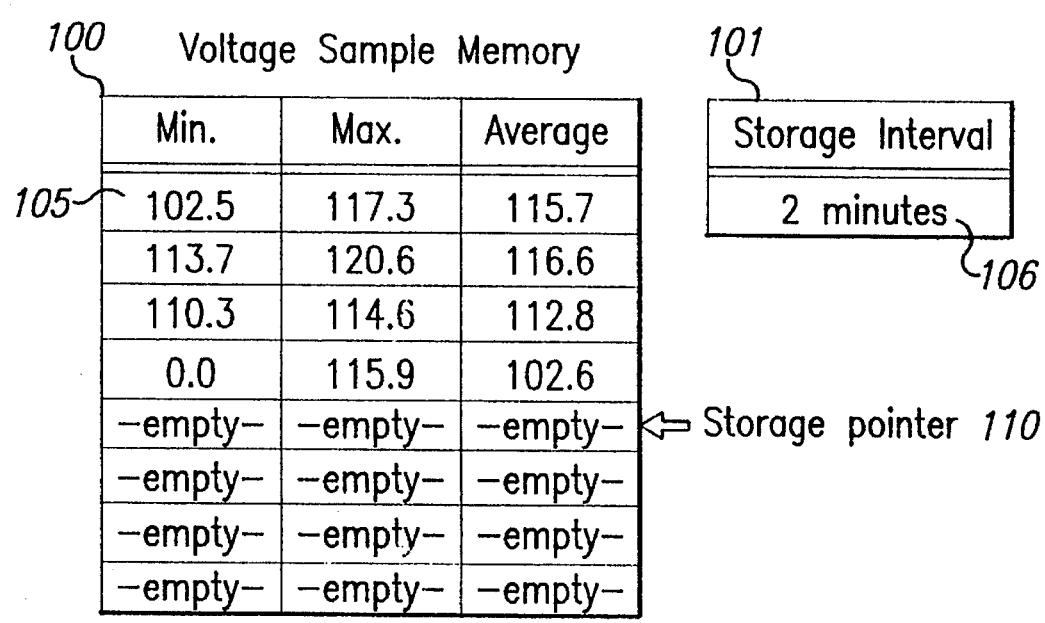

FIG. 4A shows an example memory contents prior to execution of the compression algorithm of the invention, FIG. 4B shows the same example memory contents after execution of the compression algorithm of the invention.

FIG. 5A, FIG. 5B and FIG. 5C together show a more general version of a flow diagram of the key algorithm of the invention.

DETAILED DESCRIPTION OF A PREFERRED EMBODIMENT

Figure 1A:
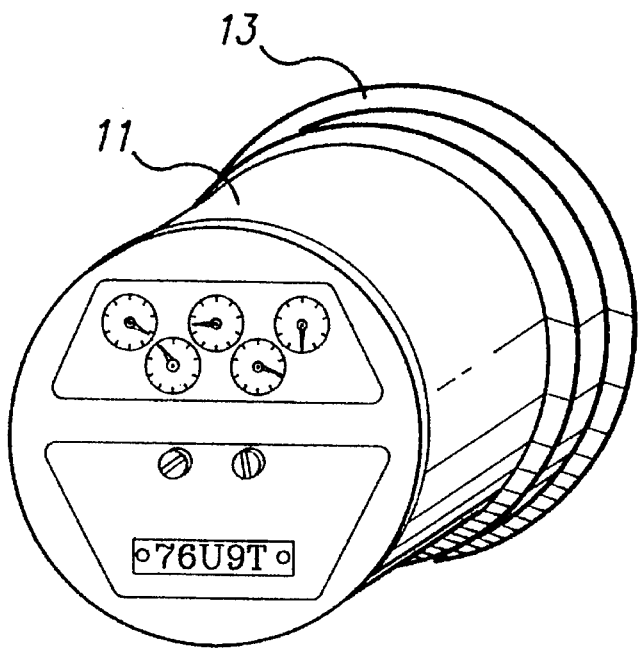
FIG. 1A shows an isometric drawing of a prior art watt-hour meter.
Figure 1B:
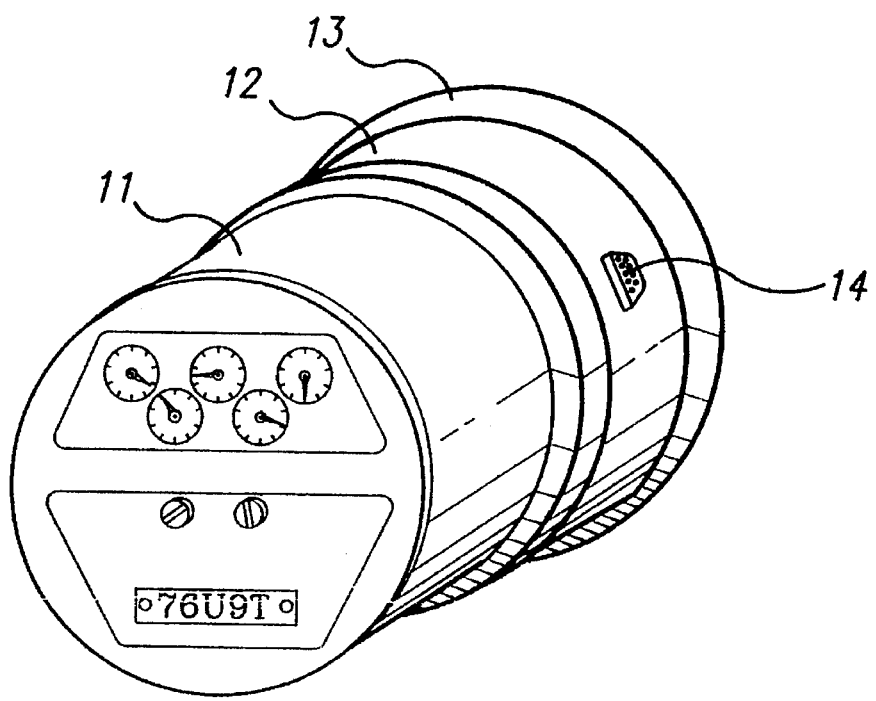

FIG. 1A shows a prior art induction watt-hour meter 11 plugged into its socket 13. FIG. 1B shows an electronic data logging instrument 12, which incorporates the preferred embodiment of the invention, inserted between the induction watt-hour meter 11 and its socket 13. The instrument 12 records power system parameters such as voltage, current, harmonics, and power factor, and stores the parameter readings in its memory. The user of the invention can periodically read the contents of the memory through a serial communications port 14.

Turning now to FIG. 2, we see a block diagram of an electronic data logging instrument which incorporates the preferred embodiment of the invention. A power line conductor 17 and a power neutral conductor 18 couple an AC source 20 to an AC load 21. A voltage attenuator 24 is coupled to the line conductor 17 and the neutral conductor 18 for sensing the voltage difference between the conductors. A first differential amplifier 26 is coupled to the voltage attenuator 24 and a first low-pass filter 28. A current transformer 23 and a burden resistor 25 are coupled to the line conductor 17 for sensing the current flow through the conductor. The transformer 23 and the burden resistor 25 are coupled to a second differential amplifier 27. The second differential amplifier 27 is also coupled to a second low-pass filter 29. Both the first low-pass filter 28 and the second low-pass filter 29 are coupled to a single-chip microprocessor 30 for calculating and storing the power system parameters from the voltage difference and the current in the line conductors 17 and 18. The single-chip microprocessor 30 contains a read-only memory, a random-access memory, an analog-to-digital converter, and a plurality of input-output circuits. The single-chip microprocessor is also coupled to an external random-access memory 31 for storing the power system parameters. The input-output circuits of the single-chip microprocessor 30 are coupled to a display 32 for displaying the results, control buttons 33 for controlling the display and a serial communications port 34 for transmitting the stored parameters to an external device.

As illustrated in FIG. 2, power flows from an AC source 20, such as a utility, to an AC load 21, such as a commercial building, through a line conductor 17 and a neutral conductor 18. A current transformer 23 and its associated burden resistor 25 sense the current flowing through the line conductor 17. A voltage attenuator 24 senses the voltage difference between the conductors 17 and 18, and reduces the voltage to a level appropriate for further processing by other circuits. The differential amplifiers 26 and 27 and the low pass filters 28 and 29 prepare the voltage and current signals for presentation to a single-chip microprocessor 30, which contains a microprocessor, a multiplexed analog-to-digital converter (A-to-D), read-only memory (ROM), random-access memory (RAM), and input-output circuits (I/O). The single-chip microprocessor 30 calculates the present power system parameters of interest, such as root-mean-square (RMS) voltage, RMS current, watts, volt-amps, power factor, and harmonics, then executes the storage and compression algorithm shown in FIG. 3A, FIG. 3B, and FIG. 3C. The single-chip microprocessor 30 stores the power system parameter data in an external random-access memory (RAM) 31. This stored data can be accessed at a later time through a serial communications port 34, whose connector 14 is shown on FIG. 1, or it can be sent to a display 32 by pressing a sequence of the control buttons 33.

In the preferred embodiment, the voltage attenuator 24 has a ratio of 500:1, and the current transformer 23 and the associated burden resistor 25 are designed for 10 amps full scale. In the preferred embodiment, the low-pass filters 28 and 29 are implemented as 4-pole Butterworth filters with corner frequencies of 3 kilohertz and the single-chip microprocessor 30 is a Motorola model number 68HC05M4. The values in this paragraph are given to illustrate one possible embodiment of the invention, which is defined fully by the claims below.

In FIG. 3A, FIG. 3B, and FIG. 3C we see the key algorithm of the invention, which is executed by the single-chip microprocessor 30. The parameter selected to illustrate the algorithm is root-mean-square (RMS) voltage; it will be apparent that the algorithm is equally applicable to any other time-varying parameter.

This algorithm shown in FIG. 3A, FIG. 3B, and FIG. 3C accepts a continuing stream of new RMS voltage samples; extracts minimum, maximum, and mean values from the stream; periodically stores the minimum, maximum, and mean values in memory; and, when memory is full, compresses the data in memory thus preparing the memory to accept additional minimum, maximum, and mean values. The compression algorithm, which is shown in FIG. 3C and explained in more detail below, can be best understood by referring to FIG. 4A, which shows the memory contents of a full memory just prior to execution of the compression algorithm, and FIG. 4B, which shows the memory contents of the same memory just after execution of the compression algorithm.

Turning now to FIG. 3A, the algorithm enters an infinite loop at the START 50. The Block 51 initializes the storage interval parameter, typically to a value of one minute, and initializes the storage pointer to the top of the memory. These initializations will cause the minimum, maximum, and average voltage for the prior minute to be stored once per minute in successive locations starting at the top end of memory.

The Block 52 initializes parameters for the loop that will be executed once per storage interval, such as minimum value register (min), the maximum value register (max), the average sum totalizer (avg tot), and the average counter (avg ctr).

The Block 53 acquires the present value of the power system parameter value, RMS voltage. This process requires taking one or more readings from the analog-to-digital converter of the single-chip microprocessor 30 of FIG. 2, and may also require performing calculations based on those readings using well-known techniques such as root-mean-square or watt-integration.

The Blocks 54 and 55 compare the present parameter value to the maximum value register, and update the maximum value register if necessary. The Blocks 56 and 57 perform the same function for the minimum value register. The Block 58 adds the present parameter value to the average sum totalizer and increments the average counter, both of which are necessary to prepare for calculating an average value at a later time.

The Block 59 determines if a storage interval has elapsed. If the storage interval has not elapsed, control is passed back to the Block 53, and the parameter acquisition and processing recommences. If a storage interval has elapsed, control is passed to the Block 61 of FIG. 3B.

Turning now to FIG. 3B, we see that the Block 61 calculates the average parameter value during the immediately preceding storage interval by dividing the value in the average sum totalizer register by the value in the average counter register. The Block 62 stores the minimum, maximum, and average value of the parameter during the immediately preceding storage interval in a location determined by the storage pointer. The Block 63 increments the memory pointer to the next available storage location.

The Block 64 determines if the memory is now full by examining the relationship between the storage pointer 110 of FIG. 4A and the end of memory. If the memory is not full, control is returned to the Block 52 of FIG. 3A, and the loop that is executed once each storage interval recommences. But if the memory is full, control passes to the Block 65 which compresses the data in memory by calling the COMPRESS subroutine which is shown in FIG. 3C and explained in more detail below. At the conclusion of the COMPRESS subroutine, half of the memory is empty and ready for storing additional data points, and control returns to the Block 66.

The Block 66 doubles the storage interval (from one minute to two minutes proceeding through the example shown in FIGS. 4A and 4B), and the Block 67 sets the storage pointer 110 of FIG. 4B to a location half-way through the memory where the empty locations begin. The Block 67 then passes control back to the Block 52 of FIG. 3A, and the loop that is executed once each storage interval begins again, although the length of the storage interval has now been doubled.

The compression subroutine shown in FIG. 3C can be best understood by referring to FIG. 4A and FIG. 4B along with the following explanation. FIG. 4A illustrates a full memory 100 that contained sufficient space for recording eight data points; each data point containing a representation for the minimum value, the maximum value, the average value. In the preferred embodiment, there is sufficient space for recording thousands of data points, but the memory 100 in FIG. 4A has been reduced to 8 points to simplify the illustration. The storage interval 101 in FIG. 4A is one minute 102, so the data in the memory 100 represents eight minutes of elapsed time. Control has been passed to the Block 70 of FIG. 3C because the memory in FIG. 4A is full. The Blocks 71 through 78 proceed to combine each successive pair of data points into a single data point, preserving the minimum value, maximum value, and mean value of the pair of data points. The results of this compression are shown in FIG. 4B in which each data point represents a storage interval 101 of two minutes 106 and half the memory is now empty.

Consider the first two data points 103, 104 stored in FIG. 4A which represent the first two minutes of data. The minimum values of the data points 103 and 104 are 102.5 and 115.2, so the minimum value for the first two minutes is 102.5; this becomes the minimum value of the first data point 105 in FIG. 4B. The maximum values of data points 103 and 104 are 115.9 and 117.3, so the higher of the two is the maximum value for the first two minutes and becomes the maximum value for the data point 105. The average for the first two minutes is simply the average of the averages, or (114.6+116.8)/2, or 115.7. In this way, each pair of data points in FIG. 4A is reduced to a single data point in FIG. 4B, leaving half the memory empty and ready to store additional data points.

Returning to FIG. 3C, we can see the specific implementation of the compression algorithm described above. The Block 71 initializes a compression pointer to the top of the memory; this will cause the compressed data to be stored beginning at the top of memory. The Block 72 initializes N to the value 1; this will cause the compression algorithm to begin with the first two data points.

The Blocks 73, 74, and 75 combine the two data points located at the locations N and N+i into a single data point, which the Block 76 stores at the location indicated by the compression pointer. The Block 77 increments the compression pointer, and the Block 78 increments N by 2. The Block 79 determines if the entire memory has been compressed. If it has not, the algorithm returns control to the Block 73 and the next pair of data points are compressed into a single point. If the entire memory has been compressed, control is returned to the Block 66, and the process recommences.

The doubling of samples per cycle was selected because digital computers are utilized to control the storage algorithm. It is trivial to double a binary number in a digital computer. However, there may be applications where more or less compression is desired. In such circumstances, the system can further compress the data by compressing three or more data points into a single data point, or more generally, m data points into a single data point where m is a positive integer greater than 1.

FIG. 5A, FIG. 5B and FIG. 5C illustrate this more general embodiment. Turning to FIG. 5A, FIG. 5B and FIG. 5C, we see substantially the same algorithm as was illustrated in FIG. 3A, FIG. 3B and FIG. 3C, with the difference that the algorithm illustrated in FIG. 3A, FIG. 3B and FIG. 3C compresses the data by a factor of 2, while the algorithm in FIG. 5A, FIG. 5B and FIG. 5C compresses the data by a factor of m.

Turning to FIG. 5A, we see a flow chart that is identical to FIG. 3A which has been discussed previously, except for its off-sheet reference to FIG. 5B which, in FIG. 3A, was an off-sheet reference to FIG. 3B.

Turning to FIG. 5B, we see a flow chart that is identical to FIG. 3B which has been discussed previously, except for its two off-sheet references to FIG. 5A which, in FIG. 3B, were off-sheet references to FIG. 3A, and except for Blocks 85 through 87, which replace Blocks 65 through 67 of FIG. 3B. Block 85 is identical to Block 65, except it makes an off-sheet reference to FIG. 5C instead of FIG. 3C. Block 66 of FIG. 3B multiplies the storage interval by a factor of 2; Block 86 more generally multiplies the storage interval by a factor of m. Block 67 of FIG. 3B sets the memory storage pointer to a location half-way through the memory where the empty locations begin; Block 87 more generally sets the memory storage pointer to a location 1/m through the memory, where m is the data compression factor described above.

Turning to FIG. 5C, we see a flow chart that is substantially identical to FIG. 3C which has been discussed previously, with the exceptions of Blocks 93 through 96 which have replaced Blocks 73 through 76 of FIG. 3C, and with the exception of Block 98 which has replaced Block 78 of FIG. 3C. Block 93 performs essentially the same function as Block 73 of FIG. 3C, except instead of searching through two consecutive memory cells for the smaller value, it searches through m consecutive memory cells for the smallest value. Blocks 94 and 95 have parallel changes from Blocks 74 and 75 of FIG. 3C. Block 96 simply makes a grammatical change from Block 76 of FIG. 3C, changing "smaller" to "smallest" and "larger" to "largest." Block 98 advances the source counter N by m counts, instead of advancing it the 2 counts shown in Block 78 of FIG. 3C, but is otherwise identical in function.

It will be immediately apparent that the algorithm described in FIG. 3A and FIG. 3B need not be restricted to a single power system parameter, but may be applied to several parameters simultaneously. It will also be apparent that the algorithm described in FIG. 3A and FIG. 3B need not be restricted to power system parameters, but may be applied to any parameter that is sampled at a regular interval, such as temperature, fluid level, chemical concentration or particulant count. Various modifications may be made to the preferred embodiment without departing from the spirit and scope of the invention as defined by the appended claims.

I claim:

1. An apparatus for periodically measuring a real-time power-line parameter, forming an electronic signal from each of the periodic measurements, and storing the measurements in a finite digital memory comprising:

a. means for triggering a real-time power-line measurement at a predetermined time interval one measurement per time interval forming a stream of measurements, the real-time power line measurements including a plurality of related values;

b. means for maintaining a statistical composite of the power line measurements;

c. means for storing the statistical composite into a sequentially next one of a finite number of digital memory locations once every N measurements, where N is an integer number;

d. means for determining when each of the digital memory locations contains one of the statistical composites;

e. means for combining m of the stored statistical composites into one of the finite digital memory locations so that only 1/m of the finite digital memory locations contain information, where m is an integer number;

f. means for increasing the predetermined time interval by a factor of m; and g. means for storing the statistical composite into a sequentially next one of the finite number of digital memory locations once every N×m measurements.

2. The apparatus according to claim 1 further comprising a means for communicating the stored statistical composites to an external device.

3. The apparatus according to claim 2 wherein the means for communicating comprises a display with control buttons and a serial communications port.

4. The apparatus according to claim 1 wherein the means for storing comprises a single-chip microprocessor and an external random-access memory.

* * * * *

UNITED STATES PATENT AND TRADEMARK OFFICE
CERTIFICATE OF CORRECTION

PATENT NO. : 5,481,468

DATED : January 2, 1996

INVENTOR(S) : Alexander McEachern

It is certified that error appears in the above-identified patent and that said Letters Patent is hereby corrected as shown below:

In column 2, line 61, "invention;" should have been typed --invention.--.

In column 4, line 18, ".new" should have been typed --new--.

In column 6, line 9, "N+i" should have been typed --N+1--.

Signed and Sealed this

Second Day of April, 1996

*Attest:*

BRUCE LEHMAN

*Attesting Officer*     *Commissioner of Patents and Trademarks*